(12) United States Patent
Bowers et al.

(10) Patent No.: US 8,767,792 B2
(45) Date of Patent: Jul. 1, 2014

(54) METHOD FOR ELECTRICALLY PUMPED SEMICONDUCTOR EVANESCENT LASER

(71) Applicants: John E. Bowers, Santa Barbara, CA (US); Oded Cohen, Gedera (IL); Alexander W. Fang, Fremont, CA (US); Richard Jones, Santa Clara, CA (US); Mario J. Paniccia, Santa Clara, CA (US); Hyundai Park, Goleta, CA (US)

(72) Inventors: John E. Bowers, Santa Barbara, CA (US); Oded Cohen, Gedera (IL); Alexander W. Fang, Fremont, CA (US); Richard Jones, Santa Clara, CA (US); Mario J. Paniccia, Santa Clara, CA (US); Hyundai Park, Goleta, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/838,932

(22) Filed: Mar. 15, 2013

(65) Prior Publication Data

US 2013/0195137 A1 Aug. 1, 2013

Related U.S. Application Data

(62) Division of application No. 11/479,459, filed on Jun. 30, 2006, now abandoned.

(51) Int. Cl.
*H01S 3/091* (2006.01)
*H01S 3/094* (2006.01)

(52) U.S. Cl.
USPC ......... 372/75; 372/44.01; 372/43.01; 372/74; 372/81; 385/14; 385/15

(58) Field of Classification Search
CPC ... H01S 5/18311; H01S 5/2231; H01S 5/021; H01S 5/026; H01S 2301/163; H01S 5/18308; H01S 5/18369; H01S 5/30; H01S 5/34; H01S 2301/166; H01S 5/0285; H01S 5/0424; H01S 5/0425; H01S 5/2214; H01S 5/0654; H01S 5/0655; H01S 5/2022; H01S 5/2206; H01S 5/3224; H01S 5/3426; H01S 5/3436; H01S 5/00; H01S 5/3223; H01S 5/34333; H01S 5/4006
USPC ............ 372/43.01, 44.01, 81, 74; 385/14, 15
See application file for complete search history.

(56) References Cited

U.S. PATENT DOCUMENTS 3,970,959 A   7/1976   Wang et al.
4,997,246 A   3/1991   May et al.
(Continued)

FOREIGN PATENT DOCUMENTS

CN   1756010 A   4/2006
DE   3820171 A   12/1989
(Continued)

OTHER PUBLICATIONS

Jacobsen, Rune S. et al., "Strained Silicon as a New Electro-Optic Material," *Nature Publishing Group*, Nature, vol. 441, May 11, 2006, doi: 10/10938/nature 04706, pp. 199-202.

(Continued)

*Primary Examiner* — Jessica Stultz
*Assistant Examiner* — Delma R Forde
(74) *Attorney, Agent, or Firm* — Blakely, Sokoloff, Taylor & Zafman LLP

(57) ABSTRACT

Embodiments of a method comprising guiding an optical mode with an optical waveguide disposed in silicon, overlapping both the optical waveguide and an active semiconductor material evanescently coupled to the optical waveguide with the optical mode guided through the optical waveguide, electrically pumping the active semiconductor material to inject current directed through the active semiconductor material and through the optical mode, and generating light in the active semiconductor material in response to the injected current. Other embodiments are disclosed and claimed.

9 Claims, 12 Drawing Sheets

(56) References Cited

U.S. PATENT DOCUMENTS

| | | | |
|---|---|---|---|
| 5,086,430 | A | 2/1992 | Kapon et al. |
| 5,317,587 | A | 5/1994 | Ackley et al. |
| 5,513,288 | A | 4/1996 | Mayer |
| 5,568,501 | A * | 10/1996 | Otsuka et al. ............... 372/46.01 |
| 5,787,105 | A | 7/1998 | Okamoto et al. |
| 5,838,870 | A | 11/1998 | Soref |
| 5,870,512 | A | 2/1999 | Koch et al. |
| 6,074,892 | A | 6/2000 | Bowers et al. |
| 6,130,441 | A | 10/2000 | Bowers et al. |
| 6,147,391 | A | 11/2000 | Bowers et al. |
| 6,154,475 | A | 11/2000 | Soref et al. |
| 6,172,382 | B1 | 1/2001 | Nagahama et al. |
| 6,316,281 | B1 | 11/2001 | Lee et al. |
| 6,403,975 | B1 | 6/2002 | Brunner et al. |
| 6,465,803 | B1 | 10/2002 | Bowers et al. |
| 6,597,717 | B1 | 7/2003 | Kneissl et al. |
| 6,734,453 | B2 | 5/2004 | Atanackovic et al. |
| 6,785,430 | B2 | 8/2004 | Paniccia |
| 6,828,598 | B1 | 12/2004 | Coffa et al. |
| 6,836,357 | B2 | 12/2004 | Wang et al. |
| 6,891,865 | B1 | 5/2005 | Ma |
| 7,133,586 | B2 | 11/2006 | Yegnanarayanan et al. |
| 7,245,647 | B2 * | 7/2007 | Jikutani et al. ............ 372/50.124 |
| 7,257,283 | B1 * | 8/2007 | Liu et al. .......................... 385/14 |
| 7,279,698 | B2 | 10/2007 | Gardner |
| 7,477,670 | B2 | 1/2009 | Abeles et al. |
| 7,535,089 | B2 | 5/2009 | Fitzgerald |
| 7,613,401 | B2 | 11/2009 | Matsui et al. |
| 7,639,719 | B2 * | 12/2009 | Fang et al. ....................... 372/34 |
| 7,929,588 | B2 * | 4/2011 | Ji et al. ......................... 372/45.01 |
| 8,106,379 | B2 * | 1/2012 | Bowers ............................ 257/14 |
| 8,110,823 | B2 | 2/2012 | Bowers |
| 8,538,221 | B1 * | 9/2013 | Fang et al. .................... 385/129 |
| 2005/0025419 | A1 | 2/2005 | Fish et al. |
| 2006/0045157 | A1 | 3/2006 | Ratowsky et al. |
| 2006/0093006 | A1 * | 5/2006 | Jikutani ........................ 372/50.1 |
| 2006/0239308 | A1 | 10/2006 | Husain et al. |
| 2007/0036190 | A1 * | 2/2007 | Abeles et al. .............. 372/50.23 |
| 2007/0153856 | A1 * | 7/2007 | Kageyama et al. ...... 372/45.012 |
| 2007/0189688 | A1 | 8/2007 | Dehlinger et al. |
| 2007/0291808 | A1 | 12/2007 | Ledentsov et al. |
| 2008/0002929 | A1 * | 1/2008 | Bowers et al. .................. 385/15 |
| 2008/0285606 | A1 | 11/2008 | Kippenberg et al. |
| 2009/0016399 | A1 * | 1/2009 | Bowers ...................... 372/50.21 |
| 2009/0245298 | A1 | 10/2009 | Sysak et al. |
| 2010/0158429 | A1 | 6/2010 | Popovic |
| 2010/0284019 | A1 * | 11/2010 | Fukuda .......................... 356/477 |
| 2012/0002694 | A1 * | 1/2012 | Bowers et al. .............. 372/45.01 |
| 2012/0114001 | A1 * | 5/2012 | Fang et al. .................. 372/45.01 |
| 2013/0032825 | A1 * | 2/2013 | Wasserbauer ................... 257/88 |

FOREIGN PATENT DOCUMENTS

| | | |
|---|---|---|
| EP | 0 405 758 A2 | 1/1991 |
| JP | 63-232368 | 9/1988 |
| JP | 03-030487 | 2/1991 |
| JP | 2000-022266 | 1/2000 |
| JP | 2000-089054 | 3/2000 |
| WO | WO 00/65393 | 11/2000 |

OTHER PUBLICATIONS

Bowers, J.E. et al., "Hybrid Silicon Evanescent Lasers," *Device Research Conference 2006 (DRC 2006)*, University Park, PA, Jun. 2006.

Fang, A.W. et al., "A Continuous-Wave Hybrid AlGaInAs—Silicon Evanescent Laser," *IEEE Photonics Technology Letters*, vol. 18, No. 10, pp. 1143-1145, May 2006.

Bowers, J.E. et al., "A Technology for Integrating Active Photonic Devices on SOI Wafers," *Indium Phosphide and Related Materials conference (IPRM 2006)*, Princeton, NJ, May 2006.

Park, H. et al., "An Optically Pumped Silicon Evanescent Laser Operating Continuous Wave at 60° C," *Optical Fiber Communication Conference (OFC 2006)*, paper OWH2, Mar. 2006.

Fang, A.W. et al., "Heterogeneous Integration of Silicon and AlGaInAs for a Silicon Evanescent Laser," *Proc. of SPIE 6133, (Photonics West 2006)*, vol. 6133, 61330W, San Jose, CA, Jan. 2006.

Park, H. et al., "Hybrid Silicon Evanescent Laser Fabricated With a Silicon Waveguide and III-V Offset Quantum Well," *Opt. Express*, vol. 13, No. 23, pp. 9460-9464, Nov. 14, 2005.

Fang, A.W. et al., "An Optically Pumped Silicon Evanescent Laser," *The 31st European Conference on Optical Communications (ECOC 2005)*, SECC, Glasgow, Scotland, Sep. 2005.

PCT/US2007/071952, International Search Report and Written Opinion, dated Dec. 26, 2007 (7 pages).

PCT/US2007/072055, International Search Report and Written Opinion, dated Oct. 30, 2008 (7 pages).

PCT/US2007/071952—International Preliminary Report on Patentability and Written Opinion, dated Jan. 6, 2009 (5 pages).

PCT/US2007/072055—International Preliminary Report on Patentability and Written Opinion, dated Jan. 6, 2009 (5 pages).

Breck Hitz, "Evanescent Coupling Lights up a Fiber," Photonics.com, Applied Physics Letters, Nov. 2006, vol. 89, 3 pages, http://www.photonics.com/Article.aspx?AID=27245.

GB0822741.5, IPO Examination Report under Section 18(3), Jan. 13, 2011 (4 pages).

GB0822741.5, IPO Examination Report under Section 18(3), Apr. 5, 2011 (3 pages).

CN 2007 80019542.1—Chinese First Office Action with English Translation, issued Apr. 21, 2010 (18 pages).

CN 2007 80019542.1—Chinese Second Office Action with English Translation, issued Nov. 16, 2010 (10 pages).

JP 2009-518497—Japanese First Office Action with English Translation, issued Sep. 27, 2011 (2 pages).

JP 2009-518497—Japanese Second Office Action with English Translation, issued Aug. 7, 2012 (2 pages).

KR 2008-7032050—Korean Office Action with English Translation, issued Aug. 9, 2010 (2 pages).

TW 096123477—Taiwan Office Action with English Translation, issued Oct. 19, 2010 (6 pages).

Rong, Haisheng et al., "A Continuous-Wave Raman Silicon Laser" Nature, vol. 433, Feb. 17, 2005, pp. 725-728.

Cutolo, Antonello et al., "Silicon Electro-Optic Modulator Based on a Three Terminal Device Integrated in a Low-Loss Single Mode SOI Waveguide," Journal of Lightwave Technology, vol. 15, No. Mar. 3, 1997, pp. 505-518.

Stankovic, S. et al., "Hybrid III-V/Silicon Laser Based on DVS-BCB Bonding" pp. 1-4.

Faist, Jerome, "Silicon Shines on" News and Views, Nature, vol. 433, Feb. 17, 2005, pp. 691-692.

Baehr-Jones, Tom et al., "All Optical Modulation in a Silicon Wageguide Based on a Single-Photon Process," IEEE Journal of Selected Topics in Quantum Electronics, vol. 14, No. 5, Sep./Oct. 2008, pp. 1335-1342.

CN 201110234336.0—Chinese First Office Action with English Translation, issued Sep. 25, 2012 (33 pages).

Google search, pp. 1-3, Feb. 16, 2008.

Fang, A. W. et al., "Electrically Pumped Hybrid AlGainAs-Silicon Evanescent Laser," Optics Express, Oct. 2, 2006, vol. 14, No. 20, pp. 9203-9210.

Fang, A. W. et al., "Integrated Hybrid Silicon Evanescent Racetrack Laser and Photodetector."

Chang, Hsu-Hao et al., "1310nm Silicon Evanescent Laser," Optical Society of America, Sep. 3, 2007, vol. 15, No. 18, pp. 11466-11471.

Park, H. et al., "Photonic Integration on Hybrid Silicon Evanescent Device Platform.".

Dr. Bowers, J., "Characterization and Optimization Study As Silicon Evanescent Racetrack Lasers," by University of California, Santa Barbara, Brian McSkimming, State University of New York at Buffalo, pp. 1-17.

Fang, A.W. et al., "Hybrid Silicon Evanescent Devices," Materials Today, Jul.-Aug. 2007, vol. 10, No. 7-8, pp. 28-35.

U.S. Office Action mailed Feb. 22, 2008, U.S. Appl. No. 11/479,459, filed Jun. 30, 2006 (6 pages).

U.S. Office Action mailed Jun. 10, 2008, U.S. Appl. No. 11/479,459, filed Jun. 30, 2006 (22 pages).

(56) References Cited

OTHER PUBLICATIONS

U.S. Office Action mailed Jan. 8, 2009, U.S. Appl. No. 11/479,459, filed Jun. 30, 2006 (13 pages).
U.S. Office Action mailed Jul. 20, 2009, U.S. Appl. No. 11/479,459, filed Jun. 30, 2006 (14 pages).
U.S. Office Action mailed Dec. 16, 2009, U.S. Appl. No. 11/479,459, filed Jun. 30, 2006 (13 pages).
U.S. Office Action mailed Jun. 15, 2010, U.S. Appl. No. 11/479,459, filed Jun. 30, 2006 (19 pages).
U.S. Office Action mailed Aug. 26, 2010, U.S. Appl. No. 11/479,459, filed Jun. 30, 2006 (13 pages).
U.S. Office Action mailed Jan. 27, 2011, U.S. Appl. No. 11/479,459, filed Jun. 30, 2006 (18 pages).
U.S. Office Action mailed Apr. 7, 2011, U.S. Appl. No. 11/479,459, filed Jun. 30, 2006 (14 pages).
U.S. Office Action mailed Oct. 7, 2011, U.S. Appl. No. 11/479,459, filed Jun. 30, 2006 (16 pages).
U.S. Office Action mailed Jan. 27, 2012, U.S. Appl. No. 11/479,459, filed Jun. 30, 2006 (19 pages).
U.S. Office Action mailed Jun. 28, 2012, U.S. Appl. No. 11/479,459, filed Jun. 30, 2006 (18 pages).
PCT/US2011/042633—International Search Report and Written Opinion, dated Oct. 20, 2011 (2 pages).
U.S. Office Action mailed May 14, 2008, U.S. Appl. No. 11/534,560, filed Sep. 22, 2006 (6 pages).
U.S. Office Action mailed Sep. 5, 2008, U.S. Appl. No. 11/534,560, filed Sep. 22, 2006 (16 pages).
U.S. Office Action mailed Sep. 29, 2009, U.S. Appl. No. 11/534,560, filed Sep. 22, 2006 (11 pages).
U.S. Office Action mailed Oct. 15, 2009, U.S. Appl. No. 11/534,560, filed Sep. 22, 2006 (25 pages).
U.S. Office Action mailed Jul. 12, 2010, U.S. Appl. No. 11/534,560, filed Sep. 22, 2006 (20 pages).
U.S. Office Action mailed Oct. 5, 2009, U.S. Appl. No. 11/734,559, filed Apr. 12, 2007 (32 pages).
U.S. Office Action mailed Jun. 3, 2010, U.S. Appl. No. 11/734,559, filed Apr. 12, 2007 (19 pages).
GB0822741.5, IPO Examination Report under Section 18(3), Feb. 18, 2011 (3 pages).
GB0822741.5, IPO Examination Report under Section 18(3), Jun. 16, 2011 (2 pages).
Park et al., "Silicon Evanescent Laser," University of California Santa Barbara, ECE Department, Santa Barbara, CA 93106-9560, (6 pages).
Bowers, "Optical Gain and Lasing on Silicon," Department of Electrical and Computer Engineering, University of California, Santa Barbara, (4 pages).
Bowers, "Silicon Evanescent Laser," Department of Electrical and Computer Engineering, University of California, Santa Barbara, (5 pages).
Zhang, J. P. et al., "Directional Light Output From Photonic-Wire Microcavity Semiconductor Lasers," IEEE Photonics Technology Letters, US, IEEE Inc. New York, vol. 8, No. 8, pp. 968-970.
Baba T, "Photonic Crystals and Microdisk Cavities Based on GaInAsP-InP System," IEEE Journal of Selected Topics in Quantum Electronics, Jun. 1997, IEEE, USA, vol. 3, No. 3, pp. 808-830.
Bowers, U.S. Appl. No. 60/760,629, filed Jan. 20, 2006.
Bowers, U.S. Appl. No. 60/795,064, filed Apr. 26, 2006.
CN 2011-10234336—Second Chinese Office Action, mailed May 17, 2013, 21 pages.
JP 2012-266047—First Japanese Office Action with English Translation, mailed Sep. 24, 2013, 6 pages.
JP 2012-266047—Japanese Final Office Action with English Translation, mailed Jan. 21, 2014, 4 pages.

\* cited by examiner

METHOD FOR ELECTRICALLY PUMPED SEMICONDUCTOR EVANESCENT LASER

CROSS-REFERENCE TO RELATED APPLICATIONS

This application is a divisional of U.S. application Ser. No. 11/479,459, filed 30 Jun. 2006, and claims priority therefrom under 35 U.S.C. §120. The priority application is currently pending.

STATEMENT REGARDING FEDERALLY SPONSORED RESEARCH AND DEVELOPMENT

This invention was made with Government support under Contract No. W911NF-05-1-0175, awarded by the Department of Defense. The Government has certain rights in this invention.

BACKGROUND OF THE DISCLOSURE

1. Field of the Invention

The disclosed embodiments relate generally to optics and, more specifically, to optical interconnects and communications.

2. Background Information

The need for fast and efficient optical-based technologies is increasing as Internet data traffic growth rate is overtaking voice traffic, pushing the need for fiber optical communications. Transmission of multiple optical channels over the same fiber in dense wavelength-division multiplexing (DWDM) systems and Gigabit (GB) Ethernet systems provide a simple way to use the unprecedented capacity (signal bandwidth) offered by fiber optics. Commonly used optical components in the system include wavelength division multiplexed (WDM) transmitters and receivers, optical filters such as diffraction gratings, thin-film filters, fiber Bragg gratings, arrayed-waveguide gratings, optical add/drop multiplexers and lasers.

Lasers are well-known devices that emit light through stimulated emission, produce coherent light beams with a frequency spectrum ranging from infrared to ultraviolet, and may be used in a vast array of applications. For example, in optical communications or networking applications, semiconductor lasers may be used to produce light or optical beams on which data or other information may be encoded and transmitted.

Additional devices used in optical communications include optical transmitters which are key components in broadband DWDM networking systems and in Gigabit (GB) Ethernet systems. Currently, most optical transmitters are based on a number of fixed-wavelength lasers combined with an external modulator or in some cases a directly-modulated laser. After light produced from a laser is modulated, it is multiplexed with an external multiplexer and then sent to an optical fiber network where it may be amplified or directed by an optical switch, or both. Separate lasers and modulators are used for each transmission channel, since the lasers typically produce a fixed wavelength. The costs of producing lasers and associated components are very high, however, and using separate components for each wavelength of light to be transmitted can be expensive and inefficient.

BRIEF DESCRIPTION OF THE DRAWINGS

The present invention is illustrated by way of example and not limitation in the accompanying figures.

DETAILED DESCRIPTION

Methods and apparatuses for providing an electrically pumped hybrid semiconductor evanescent laser array are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 1A:
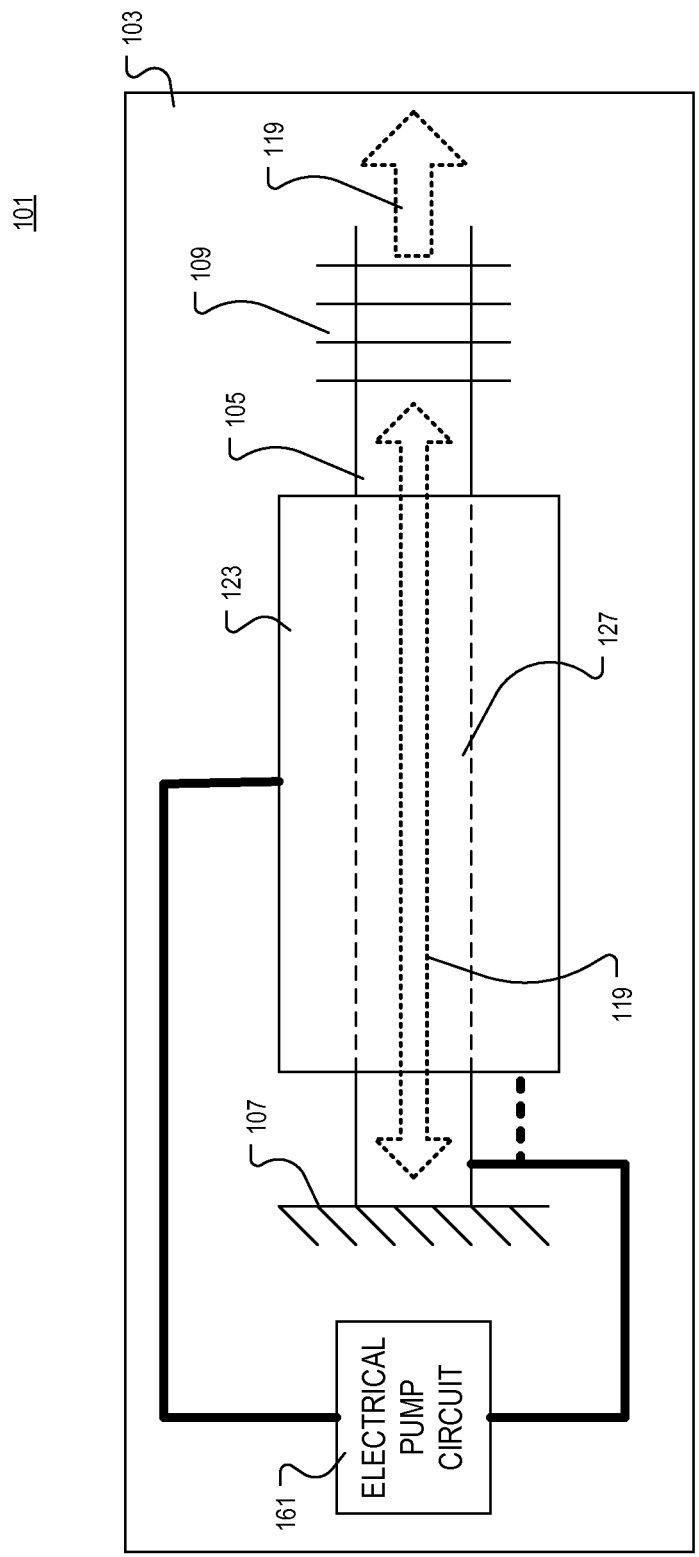
FIG. 1A is an illustration showing generally one example of an electrically pumped hybrid semiconductor evanescent laser including reflectors in accordance with the teachings of the present invention.
Figure 1B:
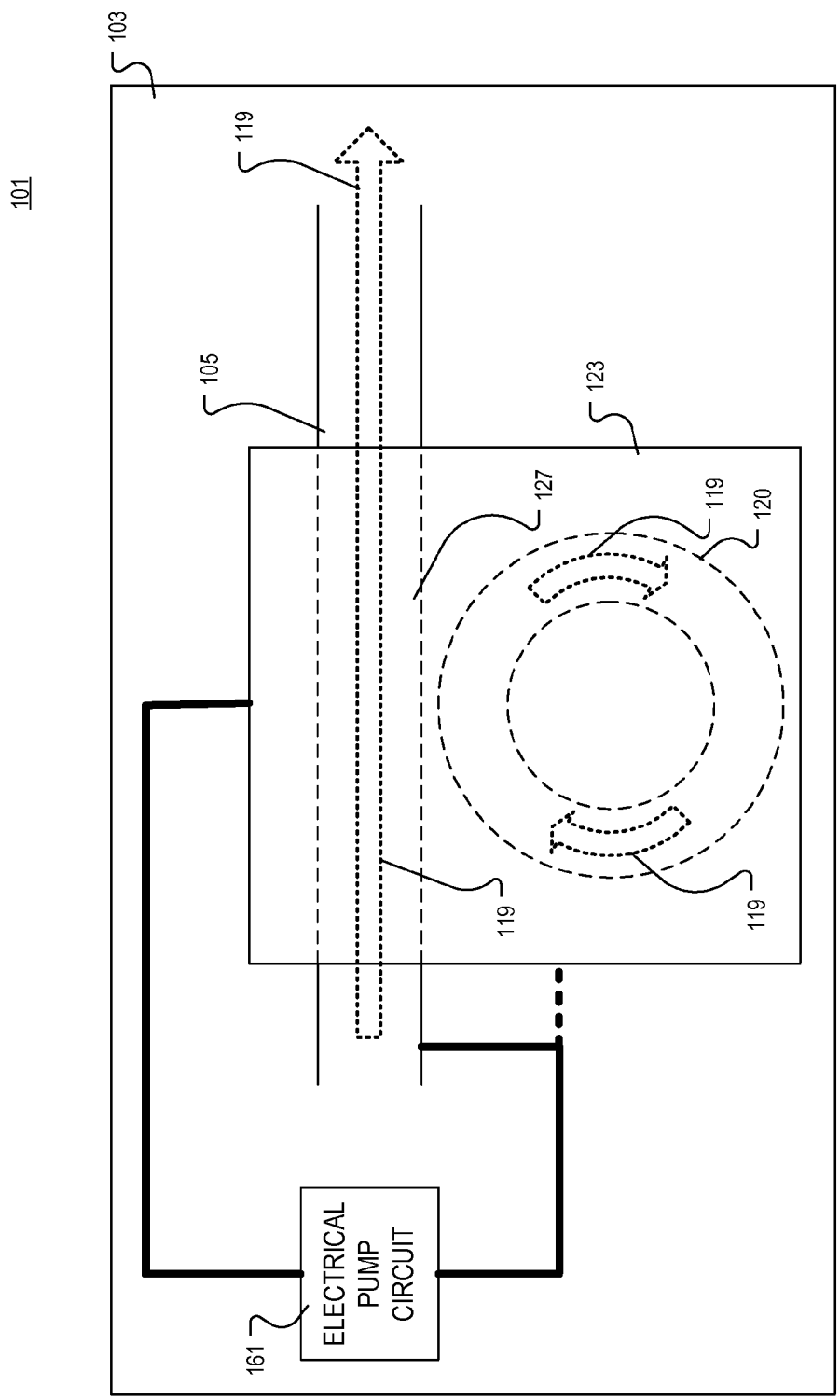
FIG. 1B is an illustration showing generally one example of an electrically pumped hybrid semiconductor evanescent laser including a ring resonator in accordance with the teachings of the present invention.

To illustrate, FIGS. 1A and 1B are illustrations showing generally examples of an electrically pumped hybrid semiconductor evanescent laser 101 including active gain medium material evanescently coupled to passive semiconductor material in accordance with the teachings of the present invention. As shown in the depicted examples, laser 101 provides an optical beam 119 from a single layer of semiconductor material 103. As shown, the single layer of semiconductor material 103 is a passive layer of silicon, such as for example the silicon layer of a silicon-on-insulator (SOI) wafer. In the illustrated examples, optical beam 119 is a laser output having a laser spectral width determined mainly by the gain and cavity reflection spectral width of the laser 101. As shown, laser 101 includes an optical waveguide 105 disposed in the single layer of semiconductor material 103. In the illustrated examples, optical waveguide 105 may be a silicon rib waveguide, a strip waveguide, or other suitable type of optical waveguide disposed in the single layer of semiconductor material 103 in accordance with the teachings of the present invention.

In the example illustrated in FIG. 1A, optical waveguide 105 includes an optical cavity 127 defined along the optical waveguide 105 between reflectors 107 and 109. In various examples, the reflectors 107 and 109 may include one or more of gratings in the semiconductor material 103, reflective coatings on facets of the semiconductor material 103, or other suitable techniques to define the optical cavities in the optical waveguide 105 in accordance with the teachings of the present invention. In another example, such as the example illustrated in FIG. 1B, laser 101 includes a ring optical waveguide 120 disposed in the semiconductor material 103 and is optically coupled to optical waveguide 105 to define an optical cavity along optical waveguide 105 in accordance with the teachings of the present invention. In the example shown in FIG. 1A in which the optical cavity includes reflectors 107 and 109, the ring resonator 120 is not included. In the example shown in FIG. 1B in which the optical cavity includes the ring resonator 120, the included reflectors 107 and 109 are not included.

As shown in the depicted examples, an active semiconductor material such as gain medium material 123 is disposed over and evanescently coupled to the single layer of semiconductor material 103 across the optical waveguide 105. For purposes of this disclosure, an active gain medium material or active semiconductor material may be interpreted as a material that emits light in response to current injection or electrical pumping or the like. Therefore, in the illustrated examples, gain medium material 123 may be an electrically pumped light emitting layer in accordance with the teachings of the present invention. In another example, there may be more than one optical waveguide 105 disposed in the single layer of semiconductor material 103 to form a plurality of lasers. In one example, the gain medium material 123 is active semiconductor material such and is III-V semiconductor bar including III-V semiconductor materials such as InP, AlGaInAs, InGaAs, and/or InP/InGaAsP, and/or other suitable materials and combinations at suitable thicknesses and doping concentrations in accordance with the teachings of the present invention. In particular, the gain medium material 123 is an offset multiple quantum well (MQW) region gain chip that is flip chip bonded or wafer bonded or epitaxially grown across the "top" of one or more optical waveguides in the silicon layer of an SOI wafer. As a result, one or more III-V lasers are formed with a gain medium-semiconductor material interface defined along optical waveguide 105. Since there are no alignment issues with bonding the gain medium material 123 bonded across the one or more optical waveguides 105 as shown, one or more lasers 101 is provided and fabricated at a fraction of the cost of attaching and aligning discrete individual lasers, such as for example Vertical-Cavity Surface-Emitting Lasers (VCSELs) or the like, in accordance with the teachings of the present invention.

In examples illustrated in FIGS. 1A and 1B, an electrical pump circuit 161 is coupled to the gain medium material 123 to electrical pump the gain medium during operation of laser 101 in accordance with the teachings of the present invention. In one example, electrical pump circuit 161 may be integrated directly within the single layer of semiconductor material 103. For instance, in one example, the single layer of semiconductor material 103 is silicon and electrical pump circuit 161 may be integrated directly in the silicon. In another example, electrical pump circuit 161 may be an external circuit to the single layer of semiconductor material 103.

As will be discussed, in one example the electrical pump circuit 161 is coupled to the gain medium material 123 as shown in FIGS. 1A and 1B such that injection current is injected into the active material of gain medium material 123 such that a current injection path is defined through the gain medium material 123 and overlaps or at least partially overlaps the optical mode or optical path of optical beam 119 in the optical cavity 127. As a result, light is generated in the optical cavity 127 in response to the electrical pumping of gain medium material 123 in response to current injection along the current injection path overlapping or at least partially overlapping the optical mode of optical beam 119 in accordance with the teachings of the present invention. With laser 101 as disclosed, optical mode 119 obtains electrically pumped gain from the active region of gain medium material 123 while being guided by the optical waveguide 105 of the passive semiconductor material 103 in accordance with the teachings of the present invention.

In another example, the electrical pump circuit 161 may also be coupled to the passive material of semiconductor material 103 such that at least a portion of the this current injection path may also pass through the optical waveguide 105 in the single layer of semiconductor material 103 as shown in FIGS. 1A and 1B in accordance with the teachings of the present invention. In such an example, the current injection path passes through passive material of semiconductor material 103 in optical waveguide 105 as well as the evanescent coupling between the single layer semiconductor material 103 and the gain medium material 123 in accordance with the teachings of the present invention.

In one example, light having a particular wavelength is reflected back and forth between reflectors 107 and 109 of FIG. 1A such that lasing occurs in optical cavity 127 at the particular wavelength. In another example, the light having a particular wavelength resonated within ring resonator 120 of FIG. 1B such that lasing occurs in the ring resonator 120 at the particular wavelength. In the various examples, the particular wavelength at which lasing occurs with optical cavity 127 is determined by wavelength of light that is reflected by reflectors 107 and/or 109 or the wavelength of light that is resonated within ring resonator 120 in accordance with the teachings of the present invention.

Figure 2:
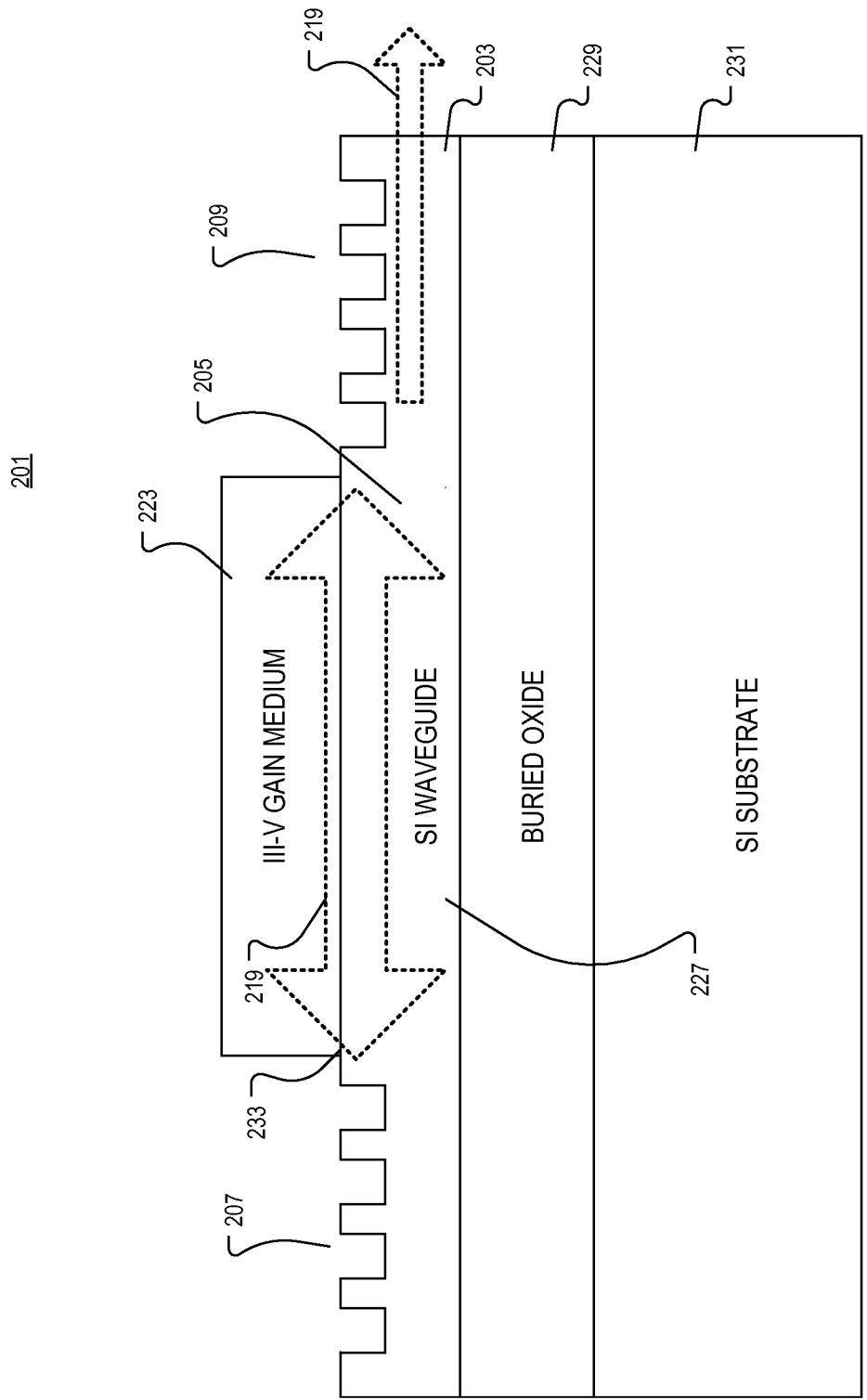
FIG. 2 is a side cross-section view showing generally one example of an electrically pumped hybrid semiconductor evanescent laser in accordance with the teachings of the present invention.

FIG. 2 is a side cross-section view showing generally an example laser 201 in accordance with the teachings of the present invention. In one example, laser 201 may correspond to the laser 101 illustrated in FIG. 1A or 1B. As shown in FIG. 2, laser 201 is integrated in an SOI wafer including a single semiconductor layer 203 with a buried oxide layer 229 disposed between the single semiconductor layer 203 and a substrate layer 231. In one example, the single semiconductor layer 203 and the substrate layer 231 are made of passive silicon. As shown, an optical waveguide 205 is disposed in the single semiconductor layer 203 through which an optical beam 219 is directed. In the example illustrated in FIG. 2, optical waveguide 205 is a rib waveguide, strip waveguide, or the like, with an optical cavity 227 defined between reflectors 207 and 209. As shown in FIG. 2, reflectors 207 and 209 are Bragg reflectors in one example in accordance with the teachings of the present invention.

Similar to the gain medium material 123 of FIG. 1A or 1B, gain medium material 223 is bonded to or epitaxially grown on "top" of the single layer of the single layer of semiconductor material 203 as shown in FIG. 2 across the "top" of and adjoining optical waveguide 205. As a result, there is a gain medium-semiconductor material interface 233 along optical waveguide 205 parallel to the direction of propagation of an optical beam along optical waveguide 205. In one example, the gain-medium-semiconductor material interface 233 is an evanescent coupling interface that may include a bonding interface between the active gain medium material 233 and the semiconductor material 203 of optical waveguide 205. For instance, such a bonding interface may include a thin $SiO_2$ layer or other suitable bonding interface material. In one example, the gain medium material 223 is an active III-V gain medium and there is an evanescent optical coupling at the gain medium-semiconductor material interface 233 between the optical waveguide 205 and the gain medium material 223. Depending on the waveguide dimensions of optical waveguide 205, a part of the optical mode of optical beam 219 is inside the III-V gain medium material 223 and a part of the optical mode of optical beam 219 is inside the optical waveguide 205. In one example the gain medium material 223 is electrically pumped to generate light in optical cavity 227.

In an example with gain medium material 223 including active material such as MQWs and with passive silicon waveguide based gratings as reflectors or mirrors, lasing is obtained within the optical cavity 227 in accordance with the teachings of the present invention. In FIG. 2, the lasing is shown with optical beam 219 reflected back and forth between reflectors 207 and 209 in optical cavity 227 with the III-V gain medium 223. In the illustrated example, reflector 209 is partially reflective such that optical beam 219 is output on the right side of FIG. 2 in accordance with the teachings of the present invention. In one example, laser 201 is a broadband laser and the reflectors 207 and 209 therefore do not need to be narrow band reflectors or Bragg gratings for the optical cavity 227, which largely reduces fabrication complexity in accordance with the present invention. In one example, lasing is demonstrated with a threshold of 120 mA, a maximum output power of 3.8 mW at 15° C. with a differential quantum efficiency of 9.6%. In one example, the laser 201 operates at at least 80° C. with a characteristic temperature of 63 K.

Figure 3:
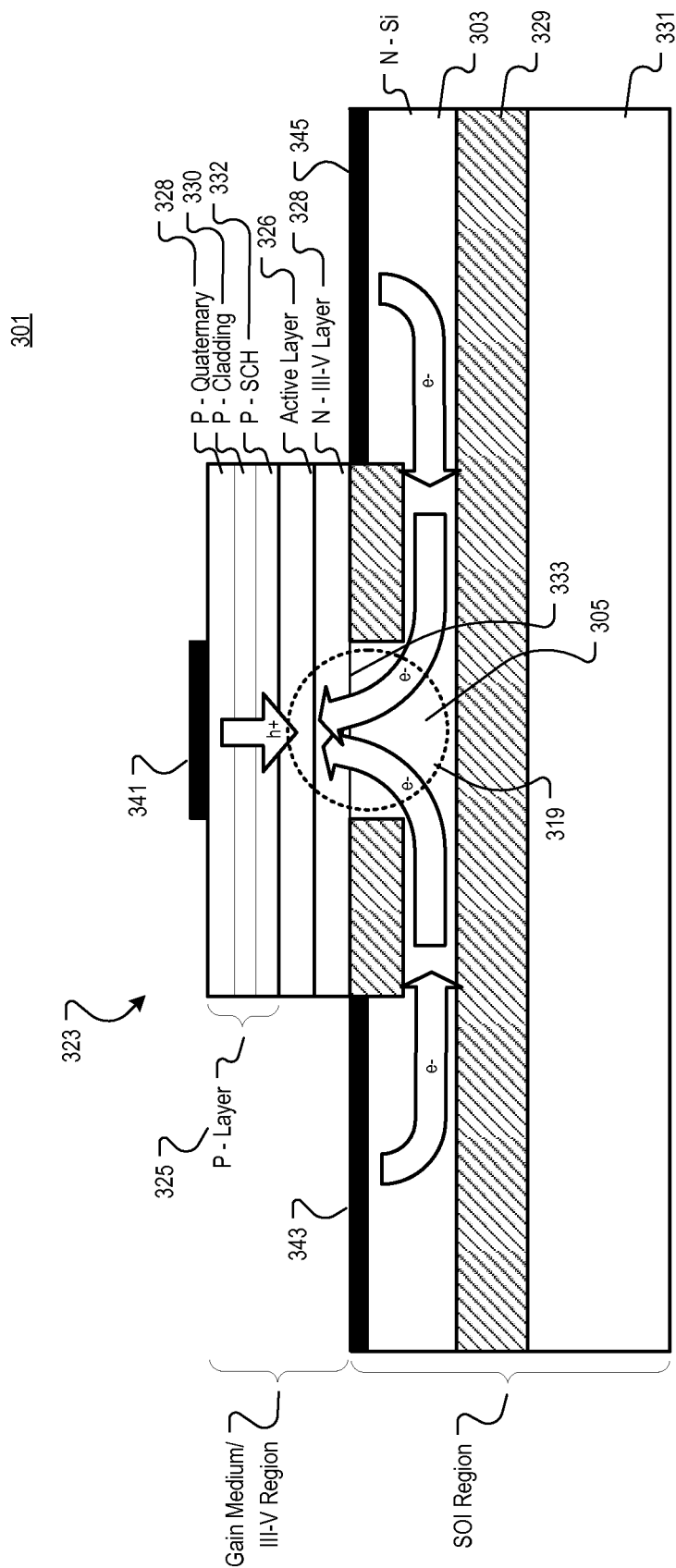
FIG. 3 is a cross-section view showing generally one example of an electrically pumped hybrid semiconductor evanescent laser in accordance with the teachings of the present invention.

FIG. 3 is a cross-section view showing generally one example of an electrically pumped hybrid semiconductor evanescent laser 301, which may correspond to one of the lasers illustrated and described above in connection with FIG. 1A, 1B or 2 in accordance with the teachings of the present invention. As shown, an SOI wafer is included having a buried oxide layer 329 disposed between a single layer of semiconductor material 303 and a semiconductor substrate 331. In another example, layer 329 may include a different material such as a buried nitride layer or a silicon oxynitride layer or other suitable type of material in accordance with the teachings of the present invention. In the illustrated example, a silicon rib waveguide 305 is disposed in the single layer of semiconductor material 303.

Continuing with the example shown in FIG. 3, gain medium material 323 is bonded on top of the optical waveguide 305 defining an evanescent coupling 333. With the evanescent coupling 333 between the gain medium material 323 and the optical waveguide 305, part of the optical mode 319 is shown to be inside the rib region of optical waveguide 305 and part of the optical mode 319 is inside gain medium material 323 depending on the dimensions of the optical waveguide 305.

As shown in FIG. 3, one example of the gain medium material 323 is III-V semiconductor material including a P-layer 325, an active layer 326 and an N-III-V layer 328 bonded to N-silicon of a single layer of semiconductor material 303. In one example, gain medium material 323 includes InP or another suitable III-V material. In one example, P-layer 325 includes a P-quaternary layer 328, a P-cladding layer 330 and a P-separated confinement heterostructure (SCH) 332, as shown in the example of FIG. 3. In one example, the active layer 326 includes a MQW material. In the illustrated example, the gain medium material 323 is bonded to and adjoining the rib region of an optical waveguide 305 in accordance with the teachings of the present invention. As shown, a contact 341 is also coupled to the gain medium material 323.

In the example shown in FIG. 3, a conductive bond design is illustrated in which current injection is performed through the silicon of the optical waveguide 305 to operate and electrically pump laser 301 in accordance with the teachings of the present invention. As such, the silicon rib waveguide 305 includes n-type doping. In the illustrated example contacts 343 and 345 are coupled to the outer portions of the slab region of the optical waveguide 305. The illustration of FIG. 3 shows one example of electrons being injected through contacts 343 and 345 through the N-doped silicon of semiconductor layer 303 to the active layer 326 and holes being injected through contact 341 through P-layer 325 to active layer 326. In the example shown in FIG. 3, electrons are illustrated as e− and holes are illustrated as h+. Accordingly, a current injection path is defined between contacts 341, 343 and 345 through the active layer 326 of gain medium material 323 and overlapping or at least partially overlapping the optical mode 319 as shown in the example of FIG. 3. Thus, light is generated in response to electrical pumping of gain medium material 323 in response to current injection along the current injection path overlapping or at least partially overlapping the optical mode of optical beam 319 in accordance with the teachings of the present invention.

It is noted that due to the symmetry of the III-V region of the gain medium material 323 in the lateral direction that no alignment step is needed between the gain medium material wafer and the optical waveguide 305 prior to bonding. Thus, large scale optical integration of electrically pumped sources on a silicon wafer that are self-aligned to passive semiconductor waveguide sections are provided in accordance with the teachings of the present invention because both laser and passive waveguides may be defined using the same complementary metal oxide semiconductor (CMOS) compatible SOI etch.

It is also noted that in the example illustrated in FIG. 3, contacts 343 and 345 are coupled to the passive N—Si of semiconductor layer 303 such that a portion of the current injection path is defined through the evanescent coupling interface 333 and through the passive semiconductor material 303. In another example, contacts 343 and 345 may be coupled to the gain medium material 323 such that the entire current injection path does not pass though the evanescent coupling interface 333 and therefore remains is within the gain medium material 323.

Figure 4:
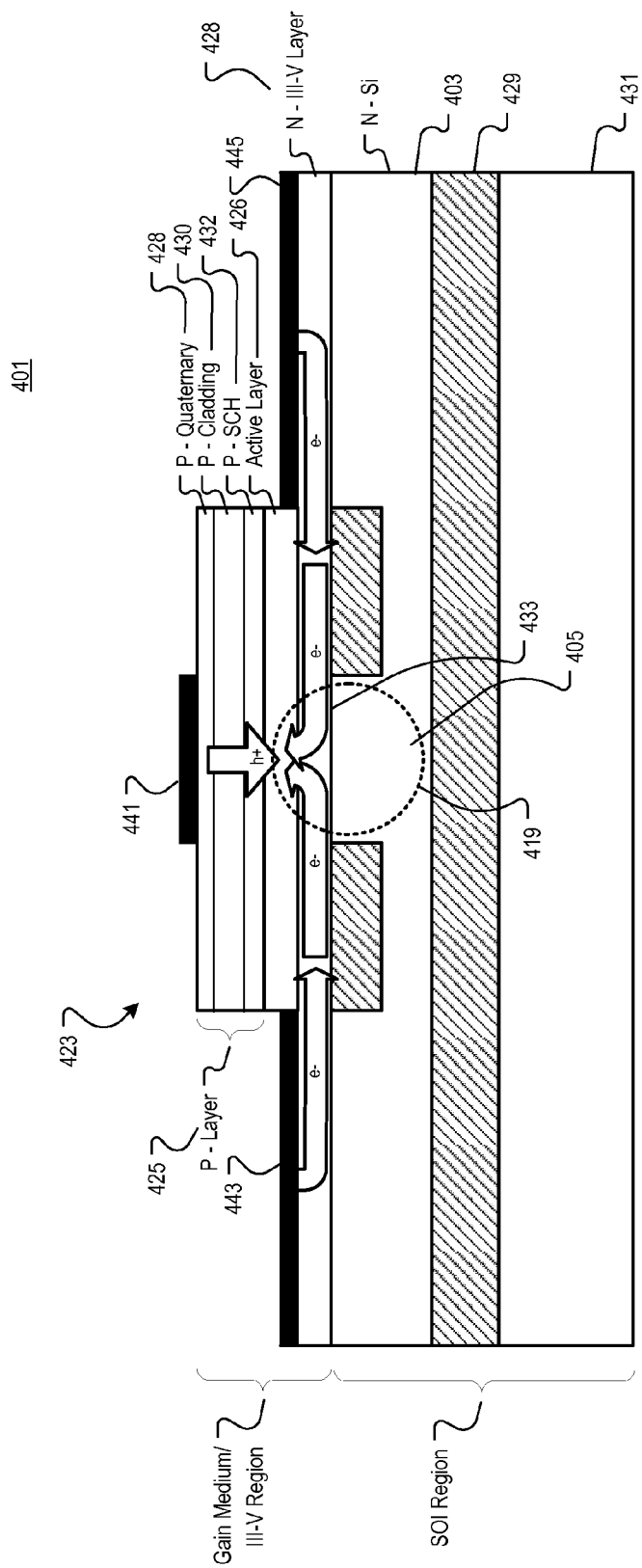
FIG. 4 is another cross-section view showing generally one example of an electrically pumped hybrid semiconductor evanescent laser in accordance with the teachings of the present invention.

To illustrate, FIG. 4 is another cross-section view showing generally another example of an electrically pumped hybrid semiconductor evanescent laser 401 in accordance with the teachings of the present invention in which the entire current injection path remains with the gain medium material. It is noted that the laser 401 of FIG. 4 may correspond to one of the lasers illustrated and described above in connection with FIG. 1A, 1B or 2 in accordance with the teachings of the present invention. As shown, an SOI wafer is included having a buried oxide layer 429 disposed between a single layer of semiconductor material 403 and a semiconductor substrate 431 of the SOI wafer. In the illustrated example, a silicon rib waveguide 405 is disposed in the single layer of semiconductor material 403. Gain medium material 423 is bonded on top of the optical waveguide 405 defining an evanescent coupling 433. With the evanescent coupling 433 between the gain medium material 423 and the optical waveguide 405, part of the optical mode 419 is shown to be inside the rib region of optical waveguide 405 and part of the optical mode 419 is inside the gain medium material 423 depending on the dimensions of the optical waveguide 405.

In the example shown in FIG. 4, one example of the gain medium material 423 is III-V semiconductor material including a P-layer 425, an active layer 426 and an N-III-V layer 428 bonded to N-silicon of a single layer of semiconductor material 403. In one example, gain medium material 423 includes InP or another suitable III-V material. In one example, P-layer 425 includes a P-quaternary layer 428, a P-cladding layer 430 and a P-SCH layer 432. In one example, the active layer 426 includes a MQW material. As shown in the illustrated example, the gain medium material 423 is bonded to and adjoining the rib region of an optical waveguide 405 in accordance with the teachings of the present invention. As shown, a contact 441 is also coupled to the gain medium material 423.

In the example shown in FIG. 4, contacts 443 and 445 are directly coupled to the N-III-V layer 428 of the gain medium material 423 instead of the outer portions of the slab region of the optical waveguide 305, when compared to laser 301 of FIG. 3. As such, the example illustrated in FIG. 4 shows that electrons are injected through contacts 443 and 445 through the N-III-V layer 428 and that holes are injected through contact 441 through P-layer 425 to active layer 426. Thus, the current injection path is defined between contacts 441, 443 and 445 through the active layer 426 of gain medium material 423 and overlapping or at least partially overlapping the optical mode 419 as shown in the example of FIG. 4. Thus, light is generated in response to electrical pumping of gain medium material 423 in response to current injection along the current injection path overlapping or at least partially overlapping the optical mode of optical beam 419 in accordance with the teachings of the present invention. It is noted that in the example illustrated in FIG. 4, with contacts 443 and 445 coupled directly the N-III-V layer 428 of the gain medium material 423, the current injection path does not to pass through the evanescent coupling interface 433 and therefore remains within the gain medium material 423.

Figure 5:
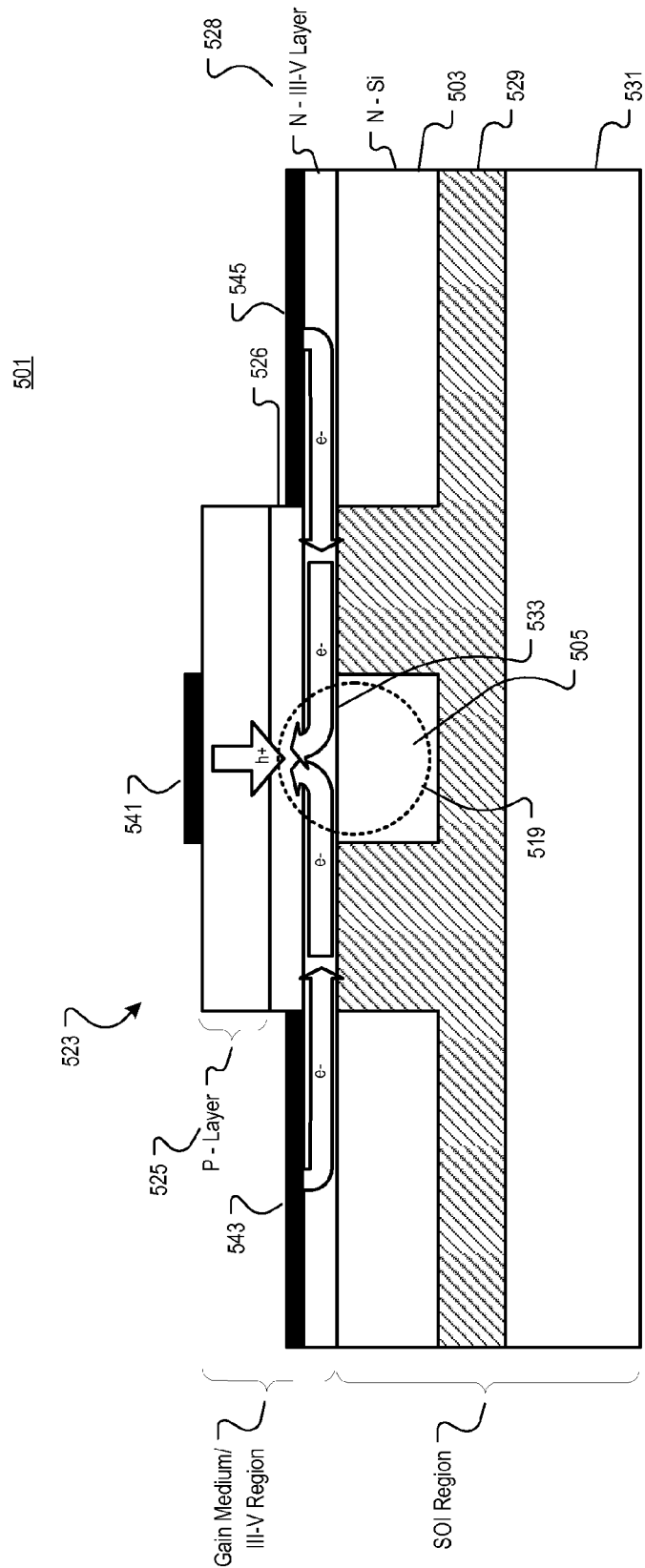
FIG. 5 is yet another cross-section view showing generally one example of an electrically pumped hybrid semiconductor evanescent laser in accordance with the teachings of the present invention.

It is noted that in the examples illustrated in FIGS. 3 and 4, optical waveguides 305 and 405 are both illustrated as rib waveguides. In other examples, it is appreciated that other suitable types of optical waveguides may also be employed in accordance with the teachings of the present invention. For instance, in another example, a strip waveguide may be employed. To illustrate, FIG. 5 is yet another cross-section view showing generally another example of an electrically pumped hybrid semiconductor evanescent laser 501 in accordance with the teachings of the present invention in which a strip waveguide is included. It is noted that the laser 501 of FIG. 5 may correspond to one of the lasers illustrated and described above in connection with FIG. 1A, 1B or 2 in accordance with the teachings of the present invention.

As shown in the depicted example, an SOI wafer is included having a buried oxide layer 529 disposed between a single layer of semiconductor material 503 and a semiconductor substrate 531 of the SOI wafer. In the illustrated example, a silicon strip waveguide 505 is disposed in the single layer of semiconductor material 503. Gain medium material 523 is bonded on top of the strip waveguide 505 defining an evanescent coupling 533. With the evanescent coupling 533 between the gain medium material 523 and the optical waveguide 505, part of the optical mode 519 is shown to be inside the optical waveguide 505 and part of the optical mode 519 is inside gain medium material 523 depending on the dimensions of the optical waveguide 505.

In the example shown in FIG. 5, one example of the gain medium material 523 is III-V semiconductor material including a P-layer 525, an active layer 526 and an N-III-V layer 528 bonded to N-silicon of a single layer of semiconductor material 503. In one example, gain medium material 523 includes materials similar to for example the materials of gain medium material 423 of FIG. 4 or gain medium material 323 of FIG. 3. As shown in the illustrated example, the gain medium material 523 is bonded to and adjoining the optical waveguide 505 in accordance with the teachings of the present invention. As shown, a contact 541 is also coupled to the gain medium material 523.

Similar to the example contacts 443 and 445 shown in FIG. 4, contacts 543 and 545 shown in FIG. 5 are directly coupled to the N-III-V layer 528 of the gain medium material 523. Accordingly, electrons are injected through contacts 543 and 545 through the N-III-V layer 528 and holes are injected through contact 541 through P-layer 525 to active layer 526. Thus, the current injection path is defined between contacts 541, 543 and 545 through the active layer 526 of gain medium material 523 and overlapping or at least partially overlapping the optical mode 519 as shown in the example of FIG. 5. Thus, light is generated in response to electrical pumping of gain medium material 523 in response to current injection along the current injection path overlapping or at least partially overlapping the optical mode of optical beam 519 in accordance with the teachings of the present invention. It is noted that in the example illustrated in FIG. 5, with contacts 543 and 545 coupled directly the N-III-V layer 528 of the gain medium material 523, the current injection path does not to pass through the evanescent coupling interface 533 and therefore remains within the gain medium material 523.

Figure 6:
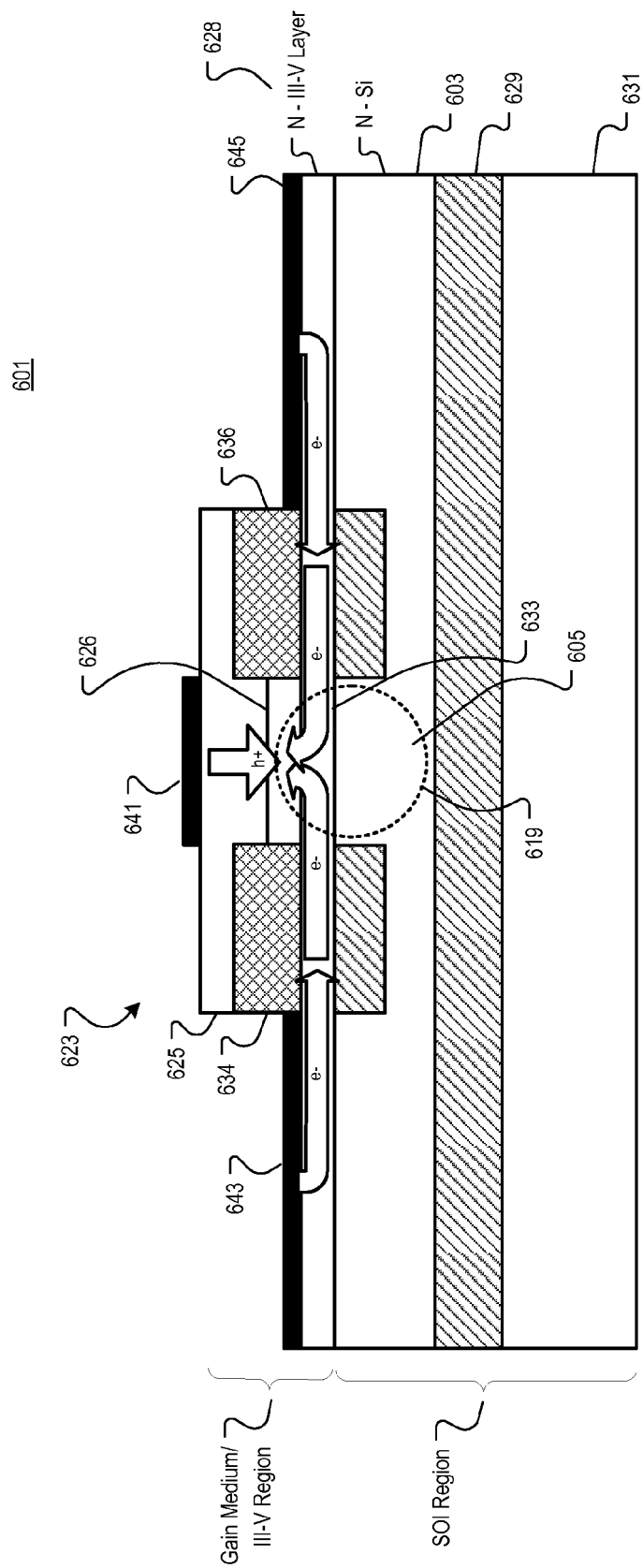
FIG. 6 is still another cross-section view showing generally one example of an electrically pumped hybrid semiconductor evanescent laser in accordance with the teachings of the present invention.

FIG. 6 is another cross-section view showing generally one example of an electrically pumped hybrid semiconductor evanescent laser 601 in accordance with the teachings of the present invention. As can be appreciated, laser 601 shares similarities with the example laser 401 of FIG. 4. For instance, the example illustrated in FIG. 6 shows an SOI wafer is included having a buried oxide layer 629 disposed between a single layer of semiconductor material 603 and a semiconductor substrate 631 of the SOI wafer. In the illustrated example, a silicon rib waveguide 605 is disposed in the single layer of semiconductor material 603. Gain medium material 623 is bonded on top of the optical waveguide 605 defining an evanescent coupling 633. With the evanescent coupling 633 between the gain medium material 623 and the optical waveguide 605, part of the optical mode 619 is shown to be inside the rib region of optical waveguide 605 and part of the optical mode 619 is inside the gain medium material 623 depending on the dimensions of the optical waveguide 605.

In the illustrated example, gain medium material 623 is III-V semiconductor material including a P-layer 625, an active layer 626 and an N-III-V layer 628 bonded to N-silicon of the single layer of semiconductor material 603. In one example, gain medium material 623 includes materials similar to for example the materials of the gain medium material 423 of FIG. 4 or gain medium material 323 of FIG. 3. As shown in the illustrated example, the gain medium material 623 is bonded to and adjoining the optical waveguide 605 in accordance with the teachings of the present invention. As shown, a contact 641 is also coupled to the gain medium material 623. Similar to contacts 443 and 445 of FIG. 4, contacts 543 and 645 are directly coupled to the N-III-V layer 628 of the gain medium material 423. As such, the example illustrated in FIG. 6 shows that electrons are injected through contacts 643 and 645 through the N-III-V layer 628 and that holes are injected through contact 641 through P-layer 625 to active layer 626. Thus, the current injection path is defined between contacts 641, 643 and 645 through the active layer 626 of gain medium material 623 and overlapping or at least partially overlapping the optical mode 619 as shown in the example of FIG. 6. Thus, light is generated in response to electrical pumping of gain medium material 623 in response to current injection along the current injection path overlapping or at least partially overlapping the optical mode of optical beam 619 in accordance with the teachings of the present invention.

One difference between laser 601 and laser 401 is that one example of laser 601 also includes confinement regions 634 and 636 as shown in FIG. 6. In one example, confinement regions 634 and 636 are confinement regions defined on opposite lateral sides of gain medium material 623 as shown to help vertically confine or focus the injection current from contact 641 to the portion of the active layer 626 overlapping or at least partially overlapping with the optical mode 619. In an example with confinement regions 634 and 636, the injection current from contact 641 tends to spread laterally, which increase loss and reduces power of laser 601. With confinement regions 634 and 636, however, more injection current is vertically confined or forced to pass through the active layer 426 and overlap the optical mode 619 in accordance with the teachings of the present invention. In the example illustrated in FIG. 6, the P-layer 625 is bombarded or implanted with protons to convert the bombarded portions the P-layer 625 into insulating or at least semi-insulating regions confinement regions 634 and 636 as shown in accordance with the teachings of the present invention. In other examples, confinement regions 634 and 636 may result from etching and regrowth or oxidation or other suitable techniques in accordance with the teachings of the present invention.

Figure 7:
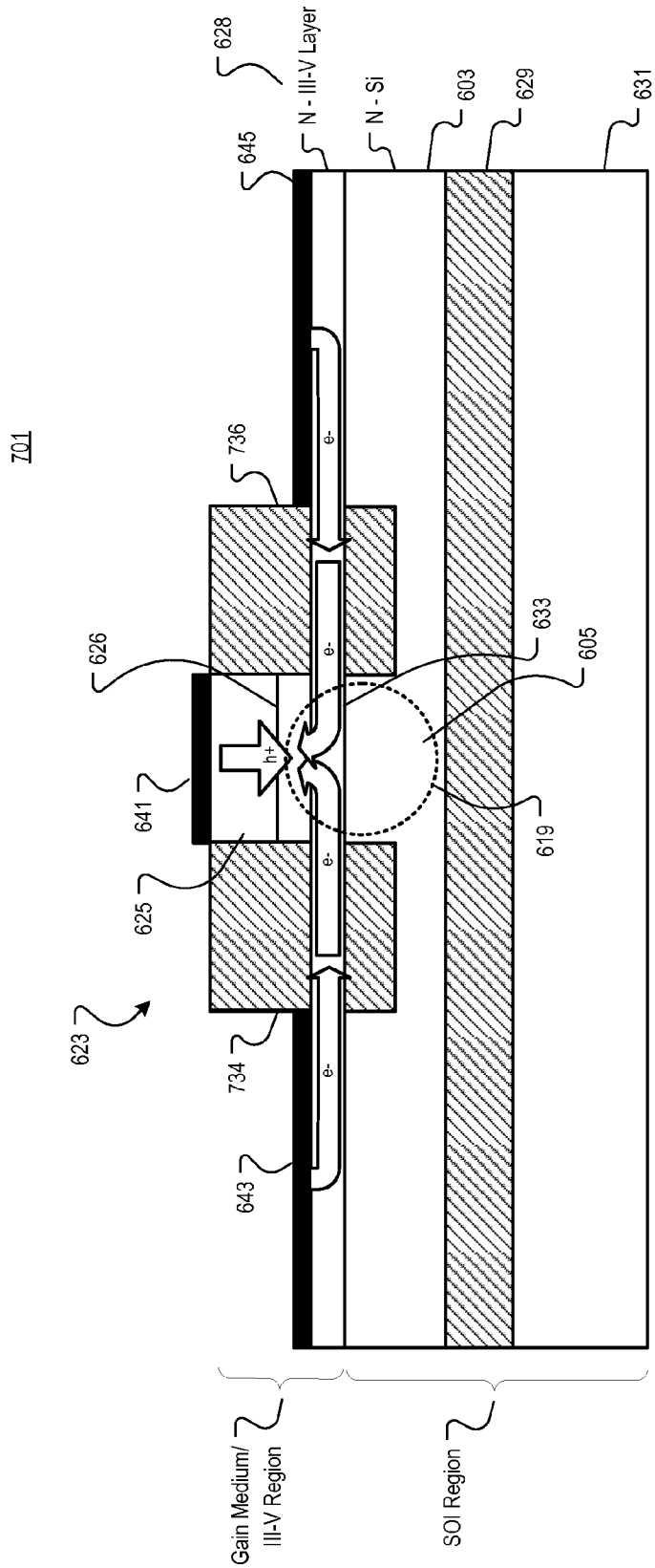
FIG. 7 is yet another cross-section view showing generally one example of an electrically pumped hybrid semiconductor evanescent laser in accordance with the teachings of the present invention.

FIG. 7 is an illustration that shows another example of a laser 701, which includes confinement regions to vertically confine the injection current in accordance with the teachings of the present invention. In one example, laser 701 shares many similarities with laser 601 of FIG. 6 and similar elements are similarly numbered in FIG. 7 accordingly. As shown in the example of FIG. 7, confinement regions 734 and 736 in laser 701 are defined on opposite lateral sides of gain medium material 623 as shown to help vertically confine or focus the injection current from contact 641 to the portion of the active layer 626 overlapping or at least partially overlapping with the optical mode 619 in accordance with the teachings of the present invention.

In one example, confinement regions 734 and 736 are provided by laterally etching the gain medium material 623 as shown to vertically confine or force the injection current down to the active layer 626. In one example, semi-insulating or insulating material, such as or example $SiO_2$ or polymer or other suitable material may be filled into the etched regions to form confinement regions 734 and 736 in accordance with the teachings of the present invention.

In another example, confinement regions 734 may be provided by implanting a material such as phosphorous or the like on opposite sides of contact 641 as shown in FIG. 7 and then annealing the resulting structure. This causes interdiffusion in the quantum wells, causing them to increase their bandgap and become transparent. Then hydrogen may be implanted in the to convert the P material into a semi-insulating material resulting in confinement regions 734 and 736 as shown in FIG. 7 in accordance with the teachings of the present invention.

Figure 8:
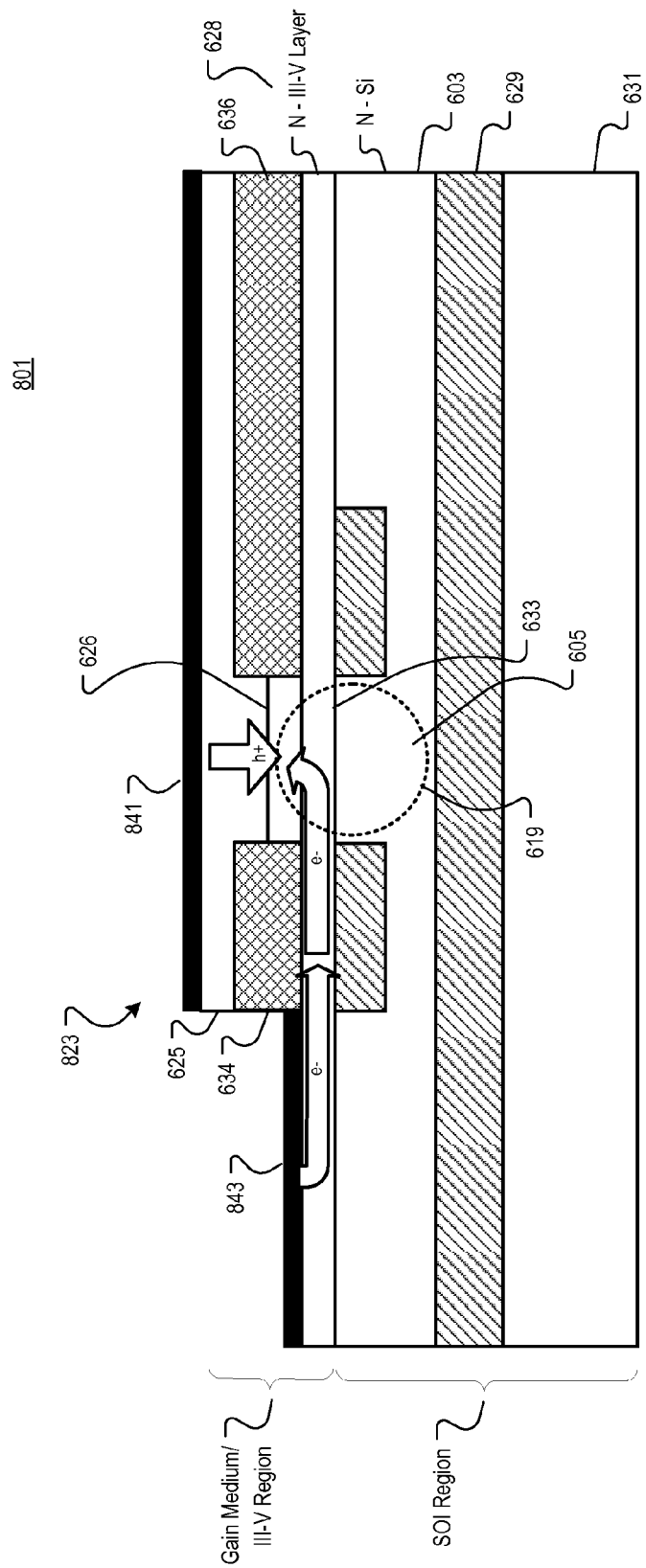
FIG. 8 is still another cross-section view showing generally one example of an electrically pumped hybrid semiconductor evanescent laser in accordance with the teachings of the present invention.

FIG. 8 is an illustration that shows yet another example of a laser 801, which also includes confinement regions 634 and 636 to vertically confine the injection current in accordance with the teachings of the present invention. In one example, laser 801 shares many similarities with laser 601 of FIG. 6 and similar elements are similarly numbered in FIG. 8 accordingly. As shown in the example of FIG. 8, laser 801 includes an asymmetric arrangement of contacts 841 and 843 when compared to for example laser 601 of FIG. 6. In particular, the surface area of the top of gain medium material 823 is larger than the surface area of the top of gain medium material 623 of FIG. 6, enabling contact 841 to be substantially larger and have an improved ohmic contact to the P-layer 625 with lower resistance. Thus, a lower overall resistance is provided between contacts 841 and 843 to provide improved performance when injecting current into the active layer 626 in accordance with the teachings of the present invention.

Figure 9:
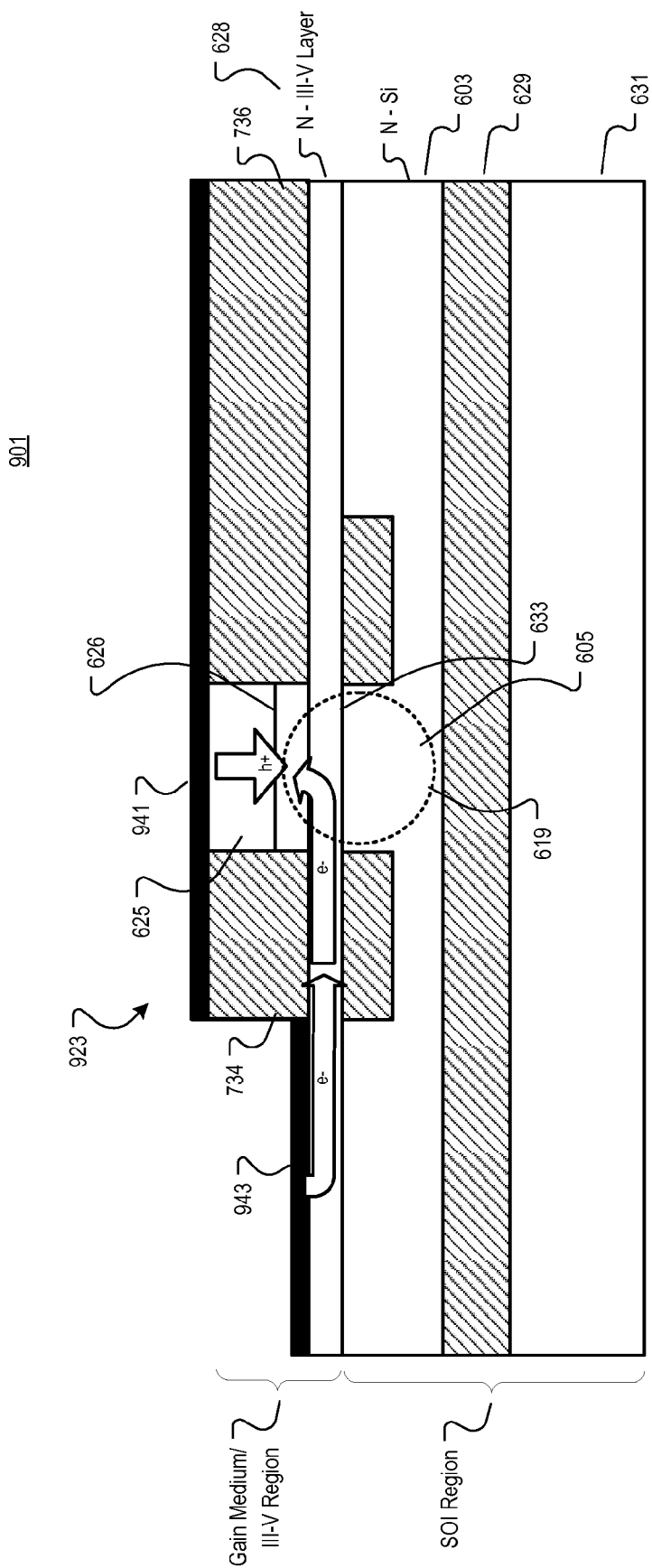
FIG. 9 is another cross-section view showing generally one example of an electrically pumped hybrid semiconductor evanescent laser in accordance with the teachings of the present invention.

FIG. 9 is an illustration that shows still another example of a laser 901, which also includes confinement regions 734 and 736 to vertically confine the injection current in accordance with the teachings of the present invention. In one example, laser 901 shares many similarities with laser 701 of FIG. 7 and similar elements are similarly numbered in FIG. 9 accordingly. As shown in the example of FIG. 9, laser 901 includes an asymmetric arrangement of contacts 941 and 943 when compared to for example laser 701 of FIG. 7. In particular, the surface area of the top of gain medium material 923 is larger than the surface area of the top of gain medium material 723 of FIG. 7, enabling contact 941 to be substantially larger and have an improved ohmic contact to the P-layer 625 with lower resistance. Thus, a lower overall resistance is provided between contacts 941 and 943 to provide improved performance when injecting current into the active layer 626 in accordance with the teachings of the present invention.

Figure 10:
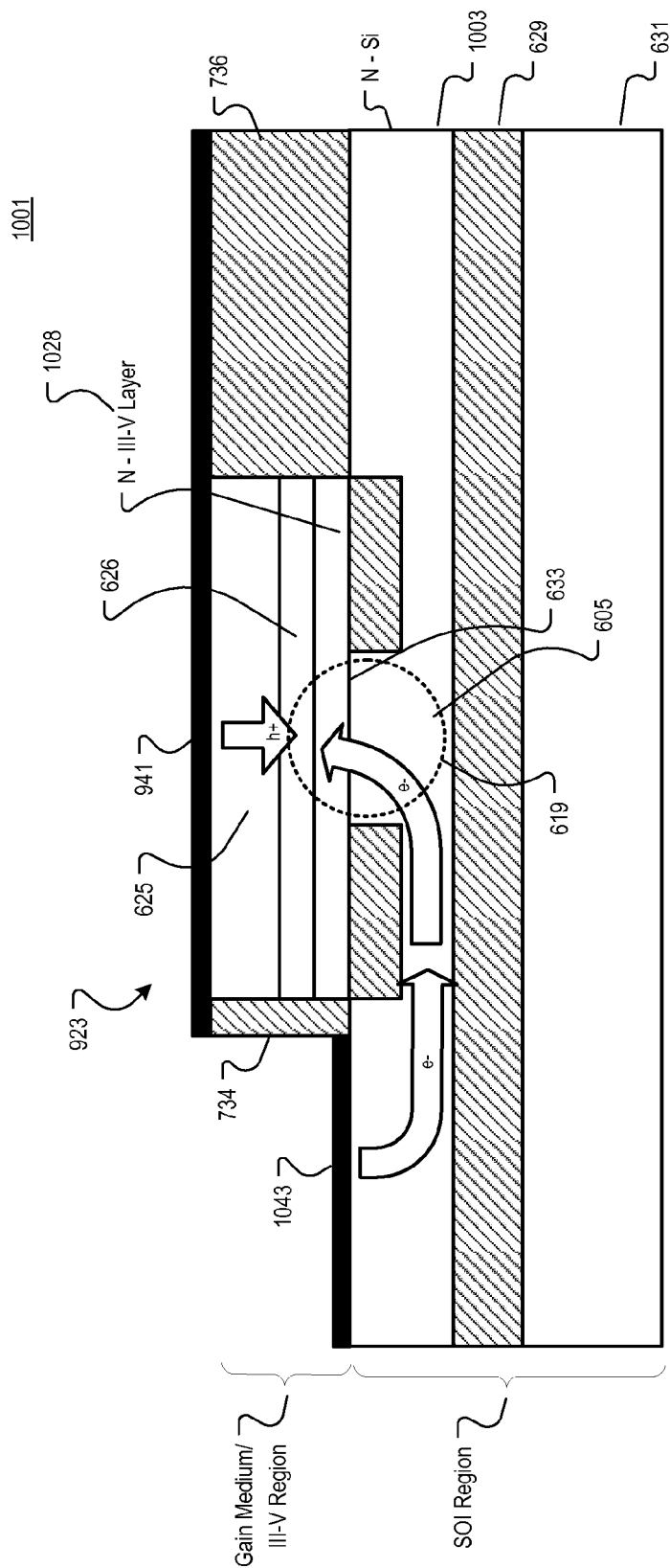
FIG. 10 is yet another cross-section view showing generally one example of an electrically pumped hybrid semiconductor evanescent laser in accordance with the teachings of the present invention.

FIG. 10 is an illustration that shows another example of a laser 1001, which also includes confinement regions 734 and 736 to vertically confine the injection current in accordance with the teachings of the present invention. In one example, laser 1001 shares many similarities with laser 901 of FIG. 9 and similar elements are similarly numbered in FIG. 10 accordingly. As shown in the example of FIG. 10, laser 1001 also includes the asymmetric arrangement of contacts 941 and 943 when compared to for example laser 901 of FIG. 9. However, instead of contact 943 being directly coupled to the N-III-V layer 628 as shown in laser 901 of FIG. 9, contact 1043 of laser 1001 is directly coupled to the N—Si of semiconductor layer 1003. As a result, the injected current path between contacts 941 and 1043 flows through the evanescent coupling 633 and the N—Si of semiconductor layer 1003. Note that with the combination of confinement regions 734 and 736 in combination with the cladding regions that defining the lateral sides of the rib region of optical waveguide 605 force or confine the injected current to flow through the optical mode 619 in the active layer 626 in accordance with the teachings of the present invention.

Figure 11:
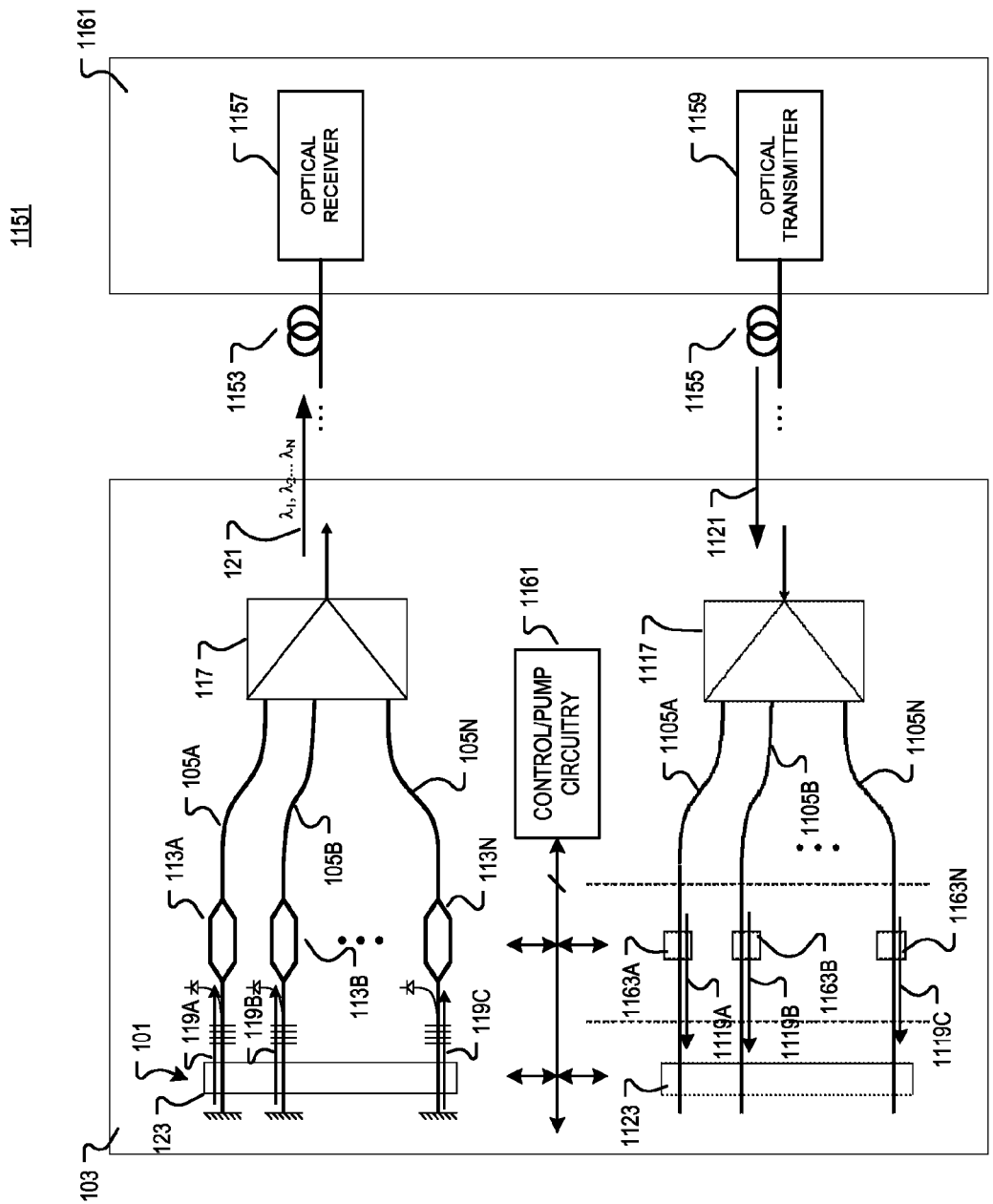
FIG. 11 is a diagram illustrating generally an example system including an ultra-high capacity transmitter-receiver with integrated semiconductor modulators and an array of electrically pumped hybrid bonded multi-wavelength lasers in accordance with the teachings of the present invention.

FIG. 11 is an illustration of an example optical system 1151 including an integrated semiconductor modulator multi-wavelength laser having an array of electrically pumped hybrid semiconductor evanescent lasers 101 including active gain medium material 123 evanescently coupled to passive semiconductor material 103 in accordance with the teachings of the present invention. In one example, it is appreciated that each of the example lasers in the array of lasers 101 may be similar to one or more of the electrically pumped hybrid lasers described previously in accordance with the teachings of the present invention. In the illustrated example, the single semiconductor layer 103 as illustrated in FIG. 11 is an optical chip that includes a plurality of optical waveguides 105A, 105B . . . 105N over which a single bar of gain medium material 123 is bonded to create an array of broadband lasers generating a plurality of optical beams 119A, 119B . . . 119N in the plurality of optical waveguides 105A, 105B . . . 105N, respectively. The plurality of optical beams 119A, 119B . . . 119N are modulated and then selected wavelengths of the plurality of optical beams 119A, 119B . . . 119N are then combined in with multiplexer 117 to output a single optical beam 121, which may be transmitted through a single optical fiber 1153 to an external optical receiver 1157 in accordance with the teachings of the present invention. In one example, the integrated semiconductor modulator multi-wavelength laser is capable of transmitting data at the multiple wavelengths included in the single optical beam 121 over the single optical fiber 1153 at speeds of more than 1 Tb/s in accordance with the teachings of the present invention. For instance, in example in which the optical modulators 113A, 113B . . . 113N included in the integrated semiconductor modulator multi-wavelength laser operate at 40 Gb/s, the total capacity of the integrated semiconductor modulator multi-wavelength laser would be N×40 Gb/s, wherein N is the total number of the waveguide based laser sources. In one example, the plurality of optical waveguides 105A, 105B . . . 105N are spaced approximately 50-100 µm apart in the single layer of semiconductor material 103. Accordingly, in one example, an entire bus of optical data is maybe transmitted from the integrated semiconductor modulator multi-wavelength laser with less than a 4 mm piece of semiconductor material 103 in accordance with the teachings of the present invention.

FIG. 11 also shows that in the example of optical system 1151, the single semiconductor layer 103 may also be coupled to receive an optical beam 1121 from an external optical transmitter 1159 through a single optical fiber 1155 in accordance with the teachings of the present invention. Therefore, in one illustrated example, the single semiconductor layer 103 is an ultra-high capacity transmitter-receiver within a small form factor in accordance with the teachings of the present invention. In the illustrated example, it is noted that external optical receiver 1157 and external optical transmitter 1159 are illustrated as existing on the same chip 1161. In another example, it is appreciated that external optical receiver 1157 and external optical transmitter 1159 may exist on separate chips. In the illustrated example, the received optical beam 1121 is received by a demultiplexer 1117, which splits the received optical beam 1121 into a plurality of optical beams 1119A, 1119B . . . 1119N. In one example, the plurality of optical beams 1119A, 1119B . . . 1119N are split according to their respective wavelengths by the demultiplexer 1117 and are then directed through a plurality of optical waveguides 1105A, 1105B . . . 1105N disposed in the single layer of semiconductor material 103.

As shown in the illustrated example, one or more optical detectors are optically coupled to each of the plurality of optical waveguides 1105A, 1105B . . . 1105N to detect the respective plurality of optical beams 1119A, 1119B . . . 1119N. In particular, in one example, an array of photodetectors 1163A, 1163B . . . 1163N is optically coupled to the plurality of optical waveguides 1105A, 1105B . . . 1105N. In one example, the array of photodetectors 1163A, 1163B . . . 1163N includes SiGe photodetectors or the like to detect the plurality of optical beams 1119A, 1119B . . . 1119N.

As shown in the depicted example, another single bar of semiconductor material 1123 may be bonded to the single layer of semiconductor material 103 across the plurality of optical waveguides 1105A, 1105B . . . 1105N to form an array of photodetectors optically coupled to the plurality of optical waveguides 1105A, 1105B . . . 1105N. In one example, the single bar of semiconductor material 1123 includes III-V semiconductor material to create III-V photodetectors optically coupled to the plurality of optical waveguides 1105A, 1105B . . . 1105N. In one example, the single bar of semiconductor material 1123 may be bonded to the single layer of semiconductor material 103 using similar techniques and technology as used to bond the single bar of semiconductor material 123 across the plurality of waveguides 105A, 105B . . . 105N in accordance with the teachings of the present invention. With SiGe and III-V based photodetectors optically coupled to the plurality of optical waveguides 1105A, 1105B . . . 1105N as shown, a variety of wavelengths for the plurality of optical beams 1119A, 1119B . . . 1119N may be detected in accordance with the teachings of the present invention.

In example illustrated in FIG. 5, control/pump circuitry 1161 may also be included or integrated in the single layer of semiconductor material 103 in accordance with teachings of the present invention. For instance, in one example, the single layer of semiconductor material 103 is silicon and control circuit 1161 may be integrated directly in the silicon. In one example, the control circuit 1161 may be electrically coupled to control, monitor and/or electrically pump any one or more of the lasers in the multi-wavelength laser array 101, the plurality of power monitors, the plurality of optical modulators, the arrays of photodetectors or other devices or structures disposed in the single layer of semiconductor material 103 in accordance with teachings of the present invention.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:
1. A method comprising:
   guiding an optical mode with an optical waveguide disposed in silicon;

overlapping both the optical waveguide and a gain medium region evanescently coupled to the optical waveguide with the optical mode guided through the optical waveguide, wherein the gain medium region is evanescently coupled to the optical waveguide;

electrically pumping the gain medium region by injecting current along a current injection path that remains entirely within the gain medium region and at least partially overlaps the optical mode;

confining the injected current with confinement regions defined in the gain medium region to direct the injected current through the optical mode, wherein the confinement regions comprise proton implanted regions of the gain medium region; and generating light in the gain medium region in response to the injected current.

2. The method of claim 1 wherein injecting current directed through the gain medium region further comprises directing the injected current through an evanescent coupling interface between the gain medium region and silicon and through the optical mode in the optical waveguide.

3. The method of claim 1 further comprising lasing light within an optical cavity including the optical waveguide.

4. An apparatus comprising:
an optical waveguide disposed in silicon;
a gain medium region disposed over the optical waveguide to define an evanescent coupling interface between the optical waveguide and the gain medium region such that an optical mode to be guided by the optical waveguide overlaps both the optical waveguide and the gain medium region; and current injection confinement regions defined on opposite lateral sides of the gain medium region to help confine the current injection through the gain medium region to overlap the optical mode wherein the current injection confinement regions comprise proton implanted regions of the gain medium region; and a current injection path that remains entirely within the gain medium region and at least partially overlaps the optical mode such that light is generated in response to electrical pumping of the gain medium region in response to current injection along the current injection path.

5. The apparatus of claim 4 wherein the gain medium region comprises an electrically pumped light emitting layer.

6. The apparatus of claim 5 wherein the gain medium region comprises multiple quantum well (MQW) regions overlapping the optical mode.

7. The apparatus of claim 4 wherein the current injection confinement regions comprise at least semi-insulating material disposed on the opposite lateral sides of the gain medium region.

8. The apparatus of claim 4 further comprising at least first and second contacts defined at opposite ends of the current injection path.

9. The apparatus of claim 4 wherein the evanescent coupling interface includes a bonding interface between the optical waveguide and the gain medium region.

* * * * *